US009817034B2

United States Patent
Li et al.

(10) Patent No.: US 9,817,034 B2
(45) Date of Patent: Nov. 14, 2017

(54) MEASURING DEVICE

(71) Applicant: VIA Alliance Semiconductor Co., Ltd., Shanghai (CN)

(72) Inventors: Peng Li, Shanghai (CN); Zhongding Liu, Shanghai (CN)

(73) Assignee: VIA ALLIANCE SEMICONDUCTOR CO., LTD., Shanghai (CN)

(*) Notice: Subject to any disclaimer, the term of this patent is extended or adjusted under 35 U.S.C. 154(b) by 210 days.

(21) Appl. No.: 14/967,951

(22) Filed: Dec. 14, 2015

(65) Prior Publication Data

US 2017/0160312 A1  Jun. 8, 2017

(30) Foreign Application Priority Data

Dec. 2, 2015 (CN) .......................... 2015 1 0874707

(51) Int. Cl.
*G01R 1/30* (2006.01)
*G01R 15/04* (2006.01)
*G01R 19/00* (2006.01)

(52) U.S. Cl.
CPC ......... *G01R 15/04* (2013.01); *G01R 19/0092* (2013.01)

(58) Field of Classification Search
CPC G01R 31/26; G01R 31/2642; G01R 31/2648; G01R 31/2831; G01R 31/31702
See application file for complete search history.

(56) References Cited

U.S. PATENT DOCUMENTS

| 8,952,671 B2 | 2/2015 | Shimizu et al. |
| 2006/0190785 A1* | 8/2006 | Pilling ............... G01R 31/2853 714/726 |
| 2011/0279133 A1* | 11/2011 | Harper ............... G01R 19/0092 324/691 |

(Continued)

FOREIGN PATENT DOCUMENTS

| CN | 102890185 A | 1/2013 |
| CN | 202956422 U | 5/2013 |

(Continued)

OTHER PUBLICATIONS

TW Office Action dated Nov. 24, 2016 in Taiwan application (No. 104141873).

*Primary Examiner* — Tung X Nguyen
(74) *Attorney, Agent, or Firm* — McClure, Qualey & Rodack, LLP (57) ABSTRACT

A measurement device measuring a current passing through a detection resistor coupled between a first node and a second node is provided. An interference elimination unit is coupled to the first and second nodes and selectively outputs the voltage of at least one of the first and second nodes according to a control signal. A first voltage-dividing unit is coupled to the interference elimination unit and processes the voltage of the first or second node to generate a first processed signal. A second voltage-dividing unit is coupled to the interference elimination unit and processes the voltage of the first or second node to generate a second processed signal. A processing unit is coupled to the first and second voltage-dividing units to receive the first and second processed signals and calculates the first and second processed signals to obtain the current passing through the detection resistor.

20 Claims, 5 Drawing Sheets

(56) References Cited

U.S. PATENT DOCUMENTS

2012/0025840 A1* 2/2012 Kim .................... G01R 31/025
                                                        324/509
2014/0253102 A1* 9/2014 Wood .................... G01R 1/203
                                                        324/140 R

FOREIGN PATENT DOCUMENTS

| CN | 204758714 U | 11/2015 |
| TW | M371236 U | 12/2009 |
| TW | 201400831 A | 1/2014 |

* cited by examiner

MEASURING DEVICE

CROSS REFERENCE TO RELATED APPLICATIONS

This Application claims priority of China Patent Application No. 201510874707.X, filed on Dec. 2, 2015, the entirety of which is incorporated by reference herein.

BACKGROUND OF THE INVENTION

Field of the Invention

The invention relates to a measurement device, and more particularly to a measurement device measuring a current passing through a detection resistor.

Description of the Related Art

Although many methods can measure current, a common method is to utilize a resistor with the accurate resistance to measure current. The common method uses Ohm's law to measure the voltage across the resistor to obtain the current passing through the resistor. To avoid the problem wherein the resistance of the resistor interferes with the current passing through the resistor, the resistance of the resistor is low. However, the voltage across the resistor with the low resistance is so low such that the voltage across the resistor is easily interfered by other signals, affecting the accuracy of the current.

BRIEF SUMMARY OF THE INVENTION

In accordance with an embodiment, a measurement device accurately measures a current passing through a detection resistor coupled between a first node and a second node and comprises an interference elimination unit, a first voltage-dividing unit, a second voltage-dividing unit, and a processing unit. The interference elimination unit is coupled to the first and second nodes and selectively outputs the voltage of at least one of the first and second nodes according to a control signal. The first voltage-dividing unit is coupled to the interference elimination unit and processes the voltage of the first or second node to generate a first processed signal. The second voltage-dividing unit is coupled to the interference elimination unit and processes the voltage of the first or second node to generate a second processed signal. The processing unit is coupled to the first and second voltage-dividing units to receive the first and second processed signals and calculates the first and second processed signals to obtain the current passing through the detection resistor.

The measurement device of the invention is utilized to obtain a perfect measured result when the resistance of the detection resistor is low and the measured result is not interfered with by noise.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
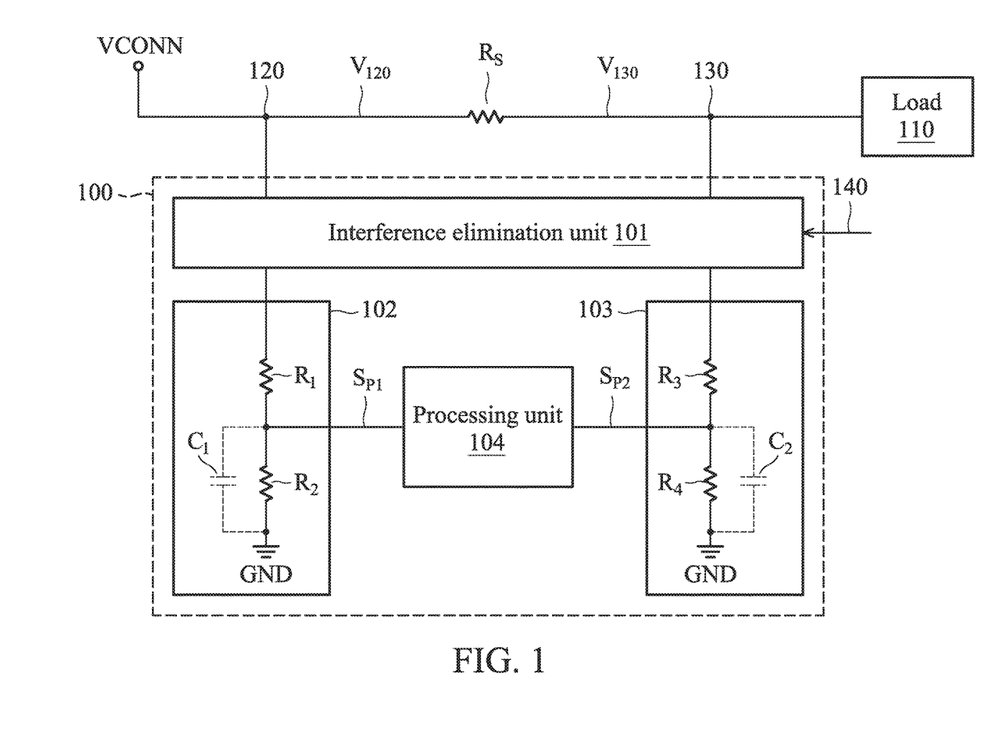
FIG. 1 is a schematic diagram of an exemplary embodiment of a measurement device according to an embodiment of the present invention.

FIG. 1 is a schematic diagram of an exemplary embodiment of a measurement device according to an embodiment of the present invention. The measurement device 100 is coupled to a detection resistor $R_S$ in parallel to measure a current passing through the detection resistor $R_S$. In this embodiment, the detection resistor $R_S$ receives a power VCONN and coupled to a load 110. In one embodiment, the load 110 is an USB type-C connector. The USB type-C connector comprises a power pin, such as VBUS, receiving the power VCONN via the detection resistor $R_S$.

In this embodiment, the measurement device 100 comprises an interference elimination unit 101, voltage-dividing units 102, 103 and a processing unit 104. The interference elimination unit 101 is coupled between two terminals of the detection resistor $R_S$. The terminals of the detection resistor $R_S$ are referred to nodes 120 and 130. The interference elimination unit 101 selectively outputs the voltage $V_{120}$ of the node 120 and/or the voltage $V_{130}$ of the node 130 according to a control signal 140. The details of the interference elimination unit 101 will be described in greater detail with reference to FIGS. 2A~2C.

The voltage-dividing unit 102 is coupled to the interference elimination unit 101 and processes the voltage output from the interference elimination unit 101 to generate a processed signal $S_{P1}$. In this embodiment, the voltage-dividing unit 102 comprises resistors $R_1$ and $R_2$, but the disclosure is not limited thereto. In other embodiments, any circuit can serve as a voltage-dividing unit 102, as long as the circuit is capable of adjusting voltage. As shown in FIG. 1, the resistor $R_1$ is connected to the resistor $R_2$ in series to divide the voltage output from the interference elimination unit 101 to generate a divided voltage. The divided voltage is served as a processed signal $S_{P1}$. The processing unit 104 receives the processed signal $S_{P1}$. In other embodiments, the voltage-dividing unit 102 further comprises a capacitor $C_1$ to eliminate noise.

The voltage-dividing unit 103 is coupled to the interference elimination unit 101 and processes the voltage output from the interference elimination unit 101 to generate a processed signal $S_{P2}$. In this embodiment, the structure of the voltage-dividing unit 103 is the same as the structure of the voltage-dividing unit 102, but the disclosure is not limited thereto. In some embodiments, the structure of the voltage-dividing unit 103 may be different from the structure of the voltage-dividing unit 102.

The voltage-dividing unit 103 comprises resistors $R_3$ and $R_4$, but the disclosure is not limited thereto. In other embodiments, any circuit can serve as a voltage-dividing unit 103, as long as the circuit is capable of adjusting voltage. The resistor $R_3$ is connected to the resistor $R_4$ in series to divide the voltage output from the interference elimination unit 101 to generate a divided voltage. The divided voltage is served as a processed signal $S_{P2}$. The processing unit 104 receives the processed signal $S_{P2}$. In other embodiments, the voltage-dividing unit 103 further comprises a capacitor $C_2$ to eliminate noise.

The processing unit 104 is coupled to the voltage-dividing units 102 and 103 to receive the processed signals $S_{P1}$ and $S_{P2}$ and obtains the current passing through the detection resistor $R_S$ according to the processed signals $S_{P1}$ and $S_{P2}$. The invention does not limit the structure of the processing unit 104. Any circuit can serve as a processing unit 104, as long as the circuit is capable of determining the current passing through the detection resistor $R_S$ according to the voltage across the detection resistor $R_S$. In one embodiment, the processing unit 104 is an analog-to-digital converter (ADC) or an amplifier. In another embodiment, the control signal 140 is provided by the processing unit 104. In some embodiments, the control signal 140 is provided by an element outside of the measurement device 100.

In one embodiment, the load 110 is a chip with a USB type-C connector. Since the measurement device 100 needs to detect the current passing through the USB type-C connector, a detection resistor $R_S$ with the low resistance is utilized and coupled to the pin of the USB type-C connector. The measurement device 100 detects the voltage across the detection resistor $R_S$ and calculates the current passing through the USB type-C connector according to the voltage across the detection resistor $R_S$. In one embodiment, the processing unit 104 cannot operate when the voltage $V_{120}$ of the node 120 and/or the voltage $V_{130}$ of the node 130 are/is too high. Therefore, the voltage-dividing units 102 and 103 are utilized to divide the voltage $V_{120}$ of the node 120 and the voltage $V_{130}$ of the node 130. The resistors R1~R4 are designed such that the resistances of the resistors R1~R4 are equal to each other. However, in fact, a resistance error is occurred in the resistance of each of the resistors R1~R4 such that the real resistances of the resistors R1~R4 are not the same as the designed resistances of the resistors R1~R4. Since the resistance of the detection resistor $R_S$ is very low, if differences between the real resistances and the designed resistances are equal to or larger than the resistance of the detection resistor $R_S$, the measured result generated by the measurement device 100 is interfered with by the resistance errors. Therefore, the measured result cannot represent a correct current passing through the detection resistor $R_S$. However, the interference elimination unit 101 is capable of eliminating the resistance errors of the resistors R1~R4 to obtain the correct current.

Figure 2A:
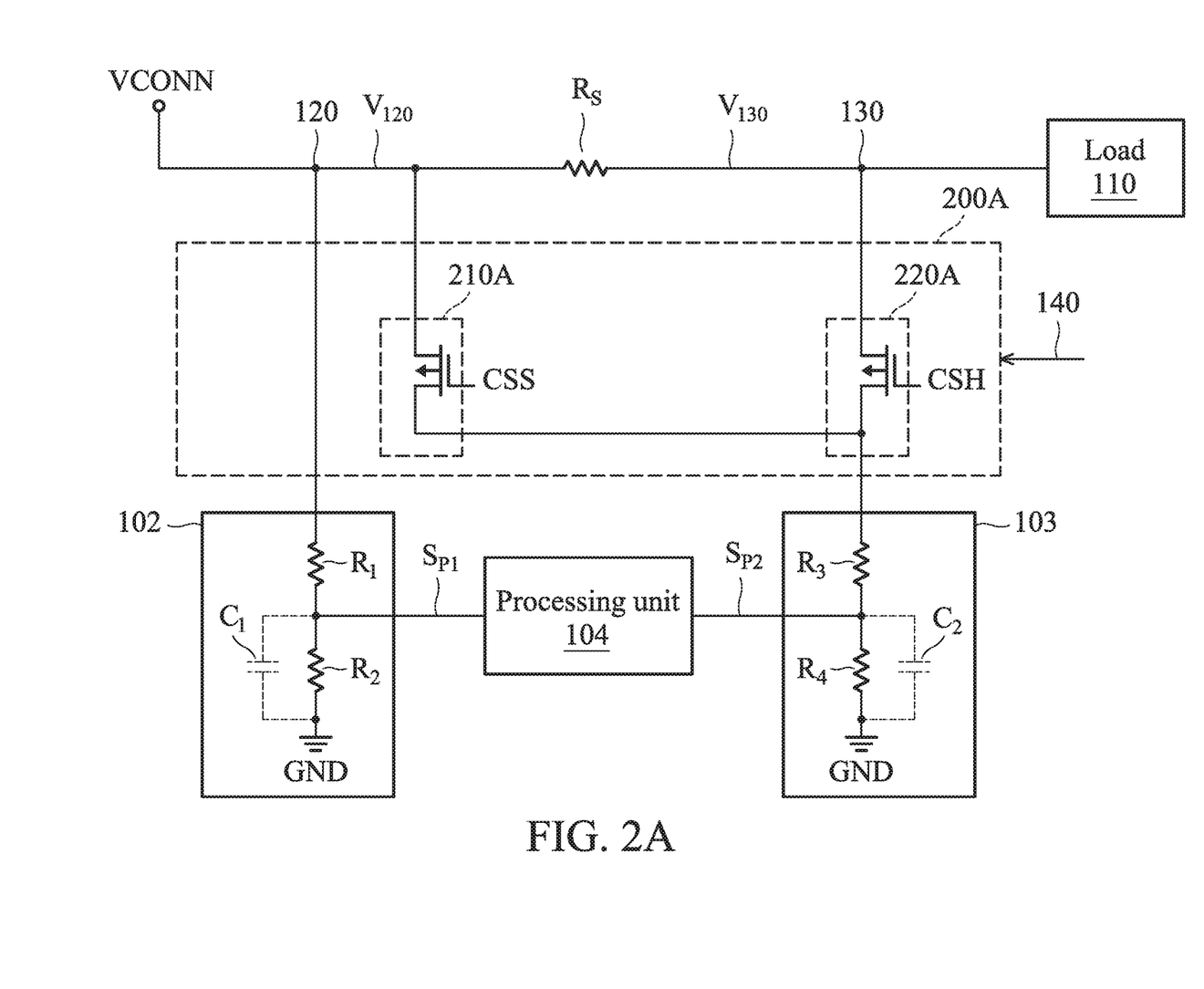
FIGS. 2A~2C are schematic diagrams of exemplary embodiments of an interference elimination unit according to an embodiment of the present invention.

FIG. 2A is a schematic diagram of an exemplary embodiment of an interference elimination unit according to an embodiment of the present invention. In this embodiment, the interference elimination unit 200A successively provides the voltage $V_{120}$ of the node 120 to the voltage-dividing unit 102 and provides the voltage $V_{120}$ of the node 120 or the voltage $V_{130}$ of the node 130 to the voltage-dividing unit 103 according to the control signal 140.

During a first sampling period, the interference elimination unit 200 provides the voltage $V_{120}$ of the node 120 to the voltage-dividing units 102 and 103. The voltage-dividing unit 102 processes the voltage $V_{120}$ of the node 120 to generate the processed signal $S_{P1}$. The voltage-dividing unit 103 processes the voltage $V_{120}$ of the node 120 to generate the processed signal $S_{P2}$. Then, the processing unit 104 generates a first sampled result according to the difference between the processed signals $S_{P1}$ and $S_{P2}$.

During a second sampling period, the interference elimination unit 200 still provides the voltage $V_{120}$ of the node 120 to the voltage-dividing unit 102. At this time, the interference elimination unit 200 provides the voltage $V_{130}$ of the node 130 to the voltage-dividing unit 103. The voltage-dividing unit 102 processes the voltage $V_{120}$ of the node 120 to generate the processed signal $S_{P1}$. The voltage-dividing unit 103 processes the voltage $V_{130}$ of the node 130 to generate the processed signal $S_{P2}$. Then, the processing unit 104 generates a second sampled result according to the difference between the processed signals $S_{P1}$ and $S_{P2}$.

During a third sampling period, the processing unit 104 determines the current passing through the detection resistor $R_S$ according to the first and second sampled results. For example, during the first sampling period, the processed signal $S_{P1}$ is equal to $V_{120}*R_2/(R_1+R_2)$, and the processed signal $S_{P2}$ is equal to $V_{120}*R_4/(R_3+R_4)$. In one embodiment, each of the resistors R1~R4 is designed to comprise the same resistance. Therefore, the first sampled result $V_{S1}$ should be equal to 0. However, in fact, since the resistance error occurs in each of the resistances of the resistors $R_1$~$R_4$, the first sampled result $V_{S1}$ may be not equal to 0. In this embodiment, the first sampled result $V_{S1}$ represents a mismatch error causing by the resistance errors of the resistances of the resistors $R_1$~$R_4$.

During the second sampling period, the processed signal $S_{P1}$ is equal to $V_{120}*R_2/(R_1+R_2)$, and the processed signal $S_{P2}$ is equal to $V_{130}*R_4/(R_3+R_4)$. Therefore, the second sampled result $V_{S2}$ is equal to $[V_{120}*R_2/(R_1+R_2)]-[V_{130}*R_4/(R_3+R_4)]$. In this embodiment, the second sampled result $V_{S2}$ has an effective component (i.e. the voltage across the detection resistor $R_S$) and the mismatch error caused by the resistance errors of the resistances of the resistors $R_1$~$R_4$.

During the third sampling period, the processing unit 104 processes the first and second sampled results to eliminate the mismatch error caused by the resistance errors of the resistances of the resistors $R_1$~$R_4$. In one embodiment, the processing unit 104 calculates the difference of the first sampled result $V_{S1}$ and the second sampled result $V_{S2}$ to eliminate the mismatch error and obtain the voltage across the detection resistor $R_S$. The processing unit 104 then determines the current passing through the detection resistor $R_S$ according to the voltage across the detection resistor $R_S$ and the resistance of the detection resistor $R_S$.

In this embodiment, the interference elimination unit 200A comprises switches 210A and 220A. The switch 210A is coupled between the node 120 and the voltage-dividing unit 103 and transmits the voltage $V_{120}$ of the node 120 to the voltage-dividing unit 103 according to a control component CSS of the control signal 140. The switch 220A is coupled between the node 130 and the voltage-dividing unit 103 and transmits the voltage $V_{130}$ of the node 130 to the voltage-dividing unit 103 according to a control component CSH of the control signal 140.

In this embodiment, the switches 210A and 220A are not simultaneously turned on. In one embodiment, the switches 210A and 220A are P-type or N-type transistors. In this case, the level of the control component CSS is opposite to the level of the control component CSH, but the disclosure is not limited thereto. In other embodiments, the control components received by the switches 210A and 220A are equal to each other. In this case, the type of switch 210A is different from the type of switch 220A. For example, one of the switches 210A and 220A is a P-type transistor and the other is an N-type transistor.

Figure 2B:
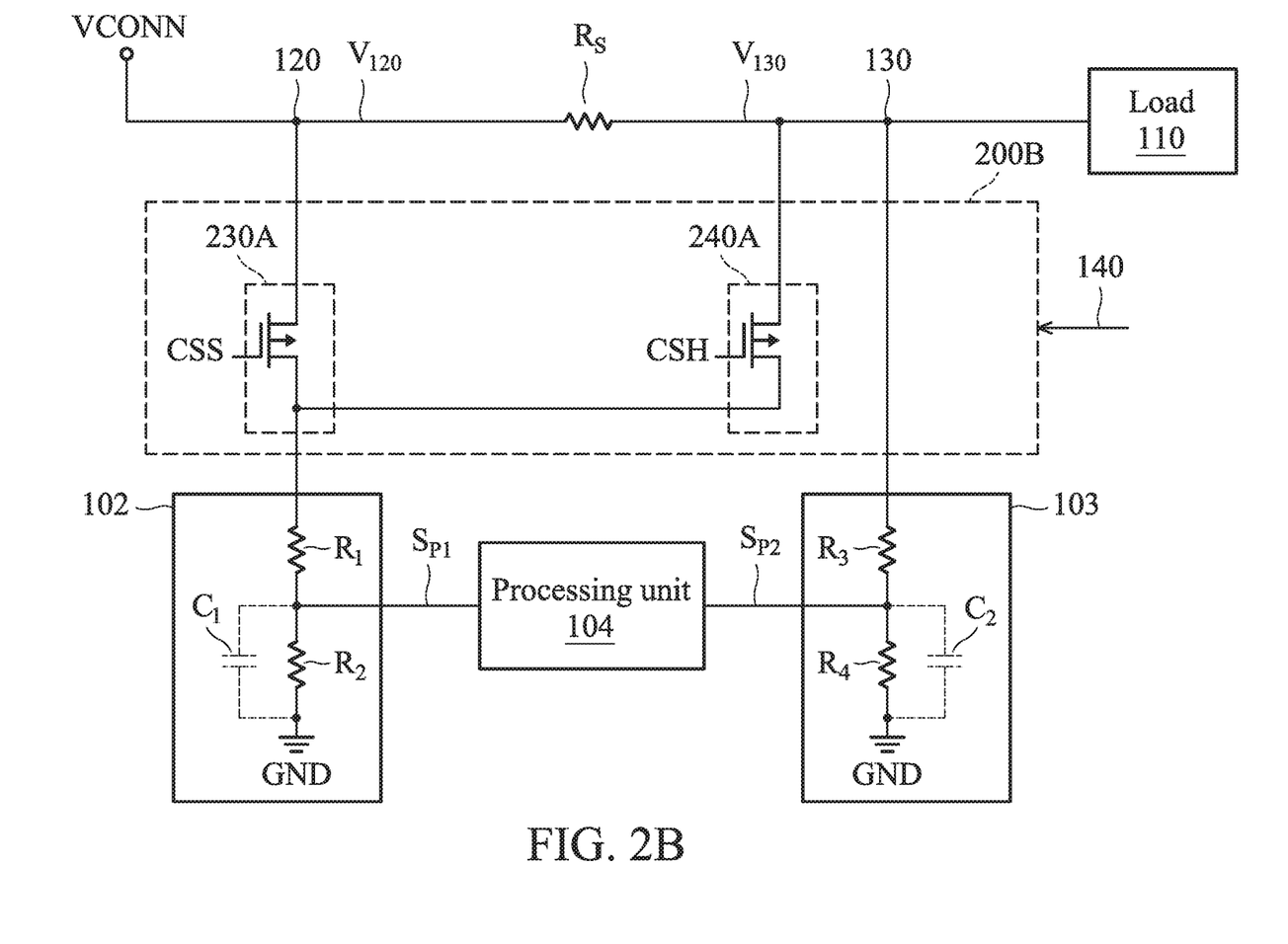

FIG. 2B is a schematic diagram of another exemplary embodiment of the interference elimination unit according to an embodiment of the present invention. In this embodiment, the interference elimination unit 200B successively provides the voltage $V_{130}$ of the node 130 to the voltage-dividing unit 103 and selectively provides the voltage $V_{120}$ of the node 120 or the voltage $V_{130}$ of the node 130 to the voltage-dividing unit 102 according to the control signal 140.

During a first sampling period, the interference elimination unit 200B provides the voltage $V_{120}$ of the node 120 to the voltage-dividing unit 102 and provides the voltage $V_{130}$ of the node 130 to the voltage-dividing unit 103. The voltage-dividing unit 102 processes the voltage $V_{120}$ of the node 120 to generate the processed signal $S_{P1}$. The voltage-dividing unit 103 processes the voltage $V_{130}$ of the node 130 to generate the processed signal $S_{P2}$. The processing unit 104 generates a first sampled result $V_{S1}$ according to a difference between the processed results $S_{P1}$ and $S_{P2}$. In this embodiment, the first sampled result $V_{S1}$ has an effective component (i.e. the voltage across the detection resistor $R_S$) and a mismatch error caused by the resistance errors of the resistances of the resistors $R_1$~$R_4$.

During a second sampling period, the interference elimination unit 200B provides the voltage $V_{130}$ of the node 130 to the voltage-dividing units 102 and 103. The voltage-dividing unit 102 processes the voltage $V_{130}$ of the node 130 to update the processed signal $S_{P1}$. The voltage-dividing unit 103 processes the voltage $V_{130}$ of the node 130 to generate the processed signal $S_{P2}$. The processing unit 104 generates a second sampled result $V_{S2}$ according to a difference between the processed results $S_{P1}$ and $S_{P2}$. In this embodiment, the second sampled result $V_{S2}$ has the mismatch error caused by the resistance errors of the resistances of the resistors $R_1$~$R_4$.

During a third sampling period, the processing unit 104 calculates and determines the current passing through the detection resistor $R_S$ according to the first and second sampled results. In this embodiment, the processing unit 104 calculates the difference between the first and second sampled results to eliminate the mismatch error caused by the resistance errors of the resistances of the resistors $R_1$~$R_4$ and obtain the voltage across the detection resistor $R_S$. The processing unit 104 then calculates the current passing through the detection resistor $R_S$ according to the voltage across the detection resistor $R_S$.

In this embodiment, the interference elimination unit 200B comprises switches 230A and 240A. The switch 230A is coupled between the node 120 and the voltage-dividing unit 102 and transmits the voltage $V_{120}$ of the node 120 to the voltage-dividing unit 102 according to a control component CSS of the control signal 140. The switch 240A is coupled between the node 130 and the voltage-dividing unit 102 and transmits the voltage $V_{130}$ of the node 130 to the voltage-dividing unit 102 according to a control component CSH of the control signal 140. Since the properties of the switches 230A and 240A are the same as the properties of the switches 210A and 220A, the descriptions of the properties of the switches 230A and 240A are omitted for brevity.

Figure 2C:
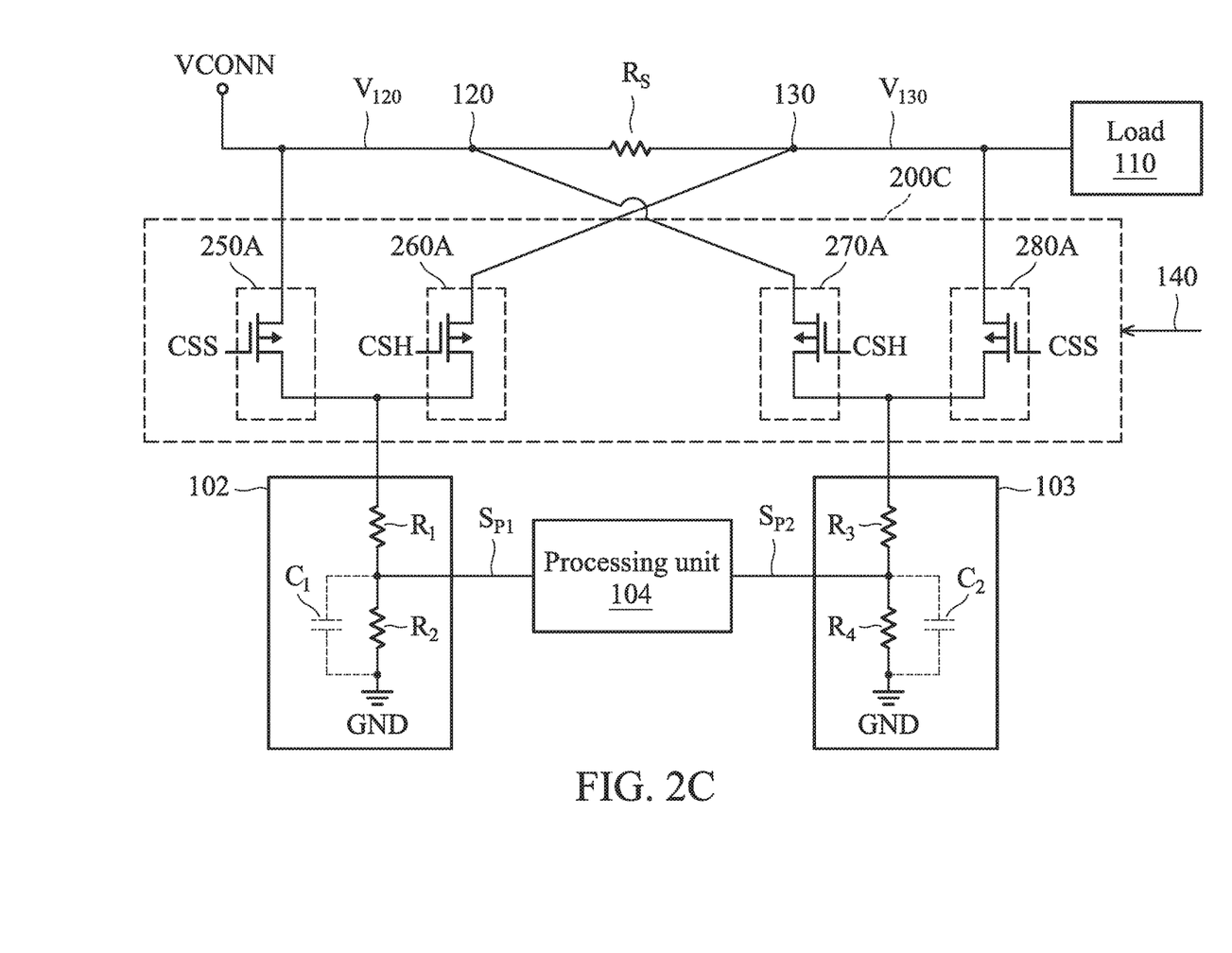

FIG. 2C is a schematic diagram of another exemplary embodiment of the interference elimination unit according to an embodiment of the present invention. In this embodiment, the interference elimination unit 200C provides either the voltage $V_{120}$ of node 120 or the voltage $V_{130}$ of node 130 to the voltage-dividing unit 102, and provides the other of the voltage $V_{120}$ of node 120 or the voltage $V_{130}$ of node 130 to the voltage-dividing unit 103. For example, when the interference elimination unit 200C provides the voltage $V_{120}$ of the node 120 to the voltage-dividing unit 102, the interference elimination unit 200C provides the voltage $V_{130}$ of the node 130 to the voltage-dividing unit 103. Similarly, when the interference elimination unit 200C provides the voltage $V_{130}$ of the node 130 to the voltage-dividing unit 102, the interference elimination unit 200C provides the voltage $V_{120}$ of the node 120 to the voltage-dividing unit 103.

During a first sampling period, the interference elimination unit 200C provides the voltage $V_{120}$ of the node 120 to the voltage-dividing unit 102 and provides the voltage $V_{130}$ of the node 130 to the voltage-dividing unit 103. The voltage-dividing unit 102 divides the voltage $V_{120}$ and has the divided voltage serve as a processed signal $S_{P1}$. Similarly, the voltage-dividing unit 103 divides the voltage $V_{130}$ and has the divided voltage serve as a processed signal $S_{P2}$. During this period, the processing unit 104 generates a first sampled result according to a difference between the processed signals $S_{P1}$ and $S_{P2}$. In this embodiment, the first sampled result has an effective component (i.e. the voltage across the detection resistor $R_S$) and a mismatch error caused by the resistance errors of the resistances of the resistors $R_1$~$R_4$. In one embodiment, the processed signal $S_{P1}$ is equal to $V_{120}*(R_2/R_1+R_2)$, the processed signal $S_{P2}$ is equal to $V_{130}*(R_4/R_3+R_4)$, the first sampled result is equal to $[V_{120}*(R_2/R_1+R_2)]-[V_{130}*(R_4/R_3+R_4)]$.

During a second sampling period, the interference elimination unit 200C provides the voltage $V_{130}$ of the node 130 to the voltage-dividing unit 102 and provides the voltage $V_{120}$ of the node 120 to the voltage-dividing unit 103. The voltage-dividing unit 102 divides the voltage $V_{130}$ and updates the processed signal $S_{P1}$ according to the divided voltage. The voltage-dividing unit 103 divides the voltage $V_{120}$ and updates the processed signal $S_{P2}$ according to the divided voltage. During this period, the processing unit 104 generates a second sampled result according to a difference between the processed signals $S_{P1}$ and $S_{P2}$. In this embodiment, the second sampled result has the effective component (i.e. the voltage across the detection resistor $R_S$) and the mismatch error caused by the resistance errors of the resistances of the resistors $R_1$~$R_4$. In this case, the polarity of the effective component in the second sampled result is opposite to the polarity of the effective component in the first sampled result. The processed signal $S_{P1}$ is equal to $V_{130}*(R_2/R_1+R_2)$, the processed signal $S_{P2}$ is equal to $V_{120}*(R_4/R_3+R_4)$, the second sampled result is equal to $[V_{120}*(R_4/R_3+R_4)]-[V_{130}*(R_2/R_1+R_2)]$.

During a third sampling period, the processing unit 104 calculates and obtains the current passing through the detection resistor $R_S$ according to the first and second sampled results. For example, during the first sampling period, the processed signal $S_{P1}$ is equal to $V_{120}*R_2/(R_1+R_2)$, and processed signal $S_{P2}$ is equal to $V_{130}*R_4/(R_3+R_4)$. Therefore, the first sampled result $V_{S1}$ is equal to $[V_{120}*R_2/(R_1+R_2)]-[V_{130}*R_4/(R_3+R_4)]$. However, because of the resistance errors of the resistances of the resistors $R_1$~$R_4$, the first sampled result $V_{S1}$ has a mismatch error caused by the resistance errors of the resistances of the resistors $R_1$~$R_4$.

During the second sampling period, the processed signal $S_{P1}$ is equal to $V_{130}*R_2/(R_1+R_2)$, and the processed signal $S_{P2}$ is equal to $V_{120}*R_4/(R_3+R_4)$. Therefore, the second sampled result $V_{S2}$ is equal to $[V_{130}*R_2/(R_1+R_2)]-[V_{120}*R_4/(R_3+R_4)]$. Similarly, the second sampled result $V_{S2}$ has the mismatch error caused by the resistance errors of the resistances of the resistors $R_1$~$R_4$.

Therefore, during the third sampling period, the processing unit 104 eliminates the mismatch error caused by the resistance errors of the resistances of the resistors $R_1$~$R_4$ according to a difference between the first sampled result $V_{S1}$ and the second sampled result $V_{S2}$ to obtain the voltage across the detection resistor $R_S$. The processing unit 104 calculates and obtains the current passing through the detection resistor $R_S$ according to the voltage across the detection resistor $R_S$ and the resistance of the detection resistor $R_S$. In this embodiment, the voltage across the detection resistor $R_S$ obtained by the processing unit shown in FIG. 2C during the third sampling period is double the voltage across the detection resistor $R_S$ obtained by the processing unit shown in FIG. 2A or FIG. 2B during the third sampling period.

In this embodiment, the interference elimination unit 200D comprises switches 250A~280A. The switch 250A is coupled between the node 120 and the voltage-dividing unit 102 and transmits the voltage $V_{120}$ of the node 120 to the voltage-dividing unit 102 according to a control component CSS of the control signal 140. The switch 260A is coupled between the node 130 and the voltage-dividing unit 102 and transmits the voltage $V_{130}$ of the node 130 to the voltage-dividing unit 102 according to a control component CSH of the control signal 140.

The switch 270A is coupled between the node 120 and the voltage-dividing unit 103 and transmits the voltage $V_{120}$ of the node 120 to the voltage-dividing unit 103 according to the control component CSH. The switch 280A is coupled between the node 130 and the voltage-dividing unit 103 and transmits the voltage $V_{130}$ of the node 130 to the voltage-dividing unit 103 according to the control component CSS.

In one embodiment, the switches 250A~280A are P-type transistors or N-type transistors. In other embodiments, the switches 250A~280A comprise P-type transistors and N-type transistors. In this embodiment, the switches 250A and 280A are simultaneously turned on, and the switches 260A and 270A are simultaneously turned on. However, when the switches 250A and 280A are turned on, the switches 260A and 270A are turned off. Similarly, when the switches 260A and 270A are turned on, the switches 250A and 280A are turned off.

Figure 3:
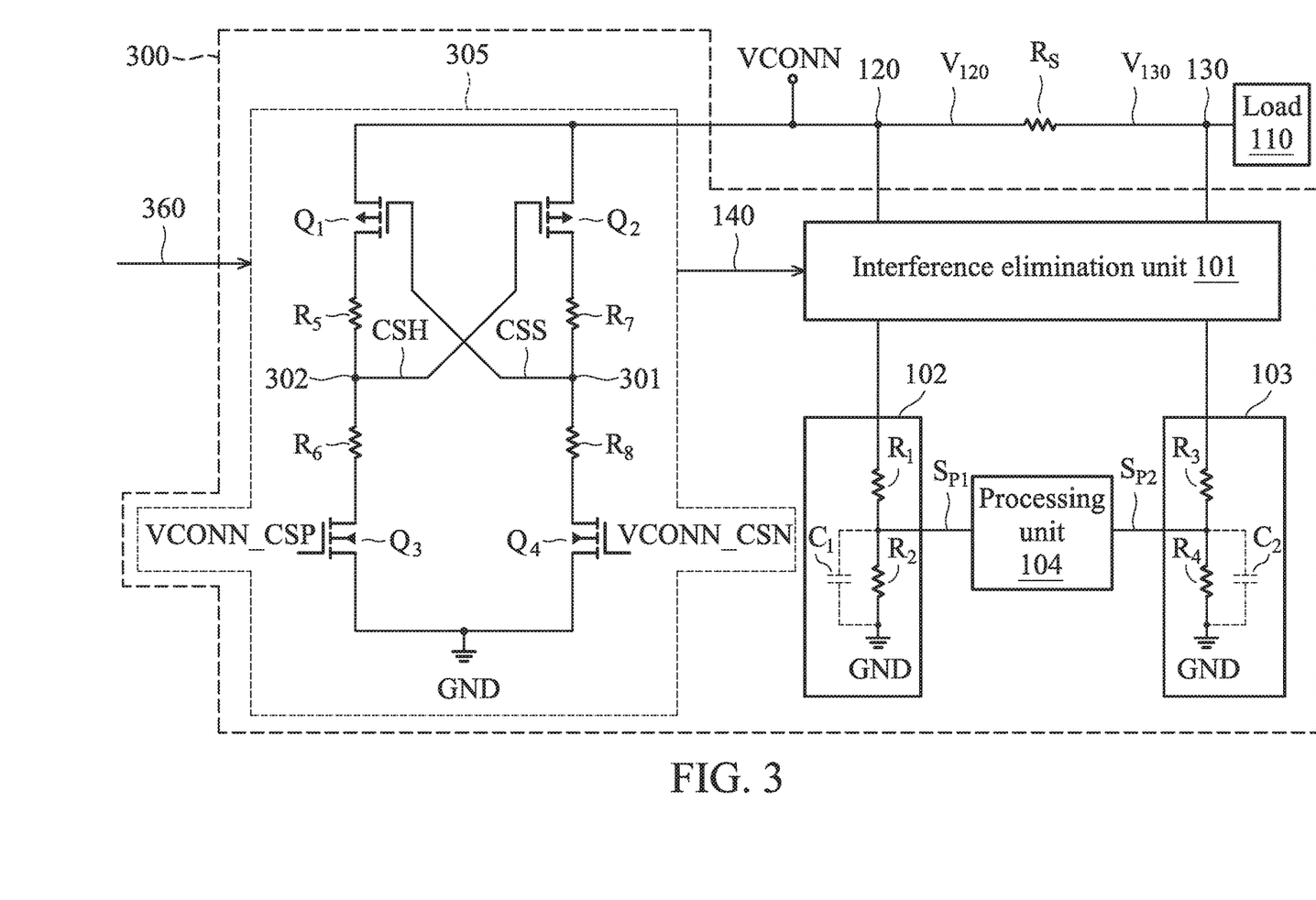
FIG. 3 is a schematic diagram of an exemplary embodiment of the measurement device according to an embodiment of the present invention.

FIG. 3 is a schematic diagram of an exemplary embodiment of the measurement device according to an embodiment of the present invention. FIG. 3 is similar to FIG. 1 except that the measurement device 300 further comprises a transformation unit 305. The transformation unit 305 is coupled to the interference elimination unit 101 and transforms a switching signal 360 into the control signal 140. In one embodiment, the switching signal 360 is provided by an element outside of the measurement device 300. In another embodiment, the switching 360 is provided by the processing unit 104. In some embodiments, the transformation unit 305 is a level shifter.

In this embodiment, the transformation unit 305 comprises transistors $Q_1$~$Q_4$ and resistors $R_5$~$R_8$, but the disclosure is not limited thereto. In other embodiments, any circuit structure can serve as a transformation unit 305, as long as the circuit structure is capable of generating signals sufficiently to drive the interference elimination unit 101.

The transistor $Q_1$, the resistors $R_5$~$R_6$, and the transistor $Q_3$ are serially connected between the power VCONN and the ground terminal GND. The transistor $Q_2$, the resistors $R_7$~$R_8$, and the transistor $Q_4$ are also serially connected between the power VCONN and the ground terminal GND. The gate of the transistor $Q_1$ is coupled to the node 301 between the resistors $R_7$~$R_8$. The gate of the transistor $Q_2$ is coupled to the node 302 between the resistors $R_5$~$R_6$. The gate of the transistor $Q_3$ receives a switching component VCONN_CSP of the switching signal 360 to generate the control component CSH in the node 302. The gate of the transistor $Q_4$ receives a switching component VCONN_CSN of the switching signal 360 to generate the control component CSS in the node 301. In one embodiment, the control signal 140 comprises the control components CSS and CSH.

In other embodiments, the switching signal 360 is generated by the processing unit 104. For example, when the operation voltage of the processing unit 104 is low, the switching signal 360 generated by the processing unit 104 may be not enough to drive the switches of the interference elimination unit 101. Therefore, the transformation unit 305 is utilized to increase the driving capability of the switching signal 360. In some embodiments, if the switching signal 360 generated by the processing unit 104 is sufficient to drive the switches of the interference elimination unit 101, the transformation unit 305 can be omitted.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A measurement device for measuring a current passing through a detection resistor coupled between a first node and a second node, comprising:
    an interference elimination unit coupled to the first and second nodes and selectively outputting the voltage of at least one of the first and second nodes according to a control signal;
    a first voltage-dividing unit coupled to the interference elimination unit and processing the voltage of the first or second node to generate a first processed signal;
    a second voltage-dividing unit coupled to the interference elimination unit and processing the voltage of the first or second node to generate a second processed signal; and
    a processing unit coupled to the first and second voltage-dividing units to receive the first and second processed signals and calculating the first and second processed signals to obtain the current passing through the detection resistor.

2. The measurement device as claimed in claim 1, wherein the interference elimination unit successively provides the voltage of the first node to the first voltage-dividing unit and provides the voltage of the first or second node to the second voltage-dividing unit according to the control signal.

3. The measurement device as claimed in claim 2, wherein the interference elimination unit provides the voltage of the first node to the second voltage-dividing unit and the processing unit generates a first sampled result according to a difference between the first and second processed signals,
    the interference elimination unit provides the voltage of the second node to the second voltage-dividing unit and the processing unit generates a second sampled result according to the difference between the first and second processed signals, and the processing unit obtains the current passing through the detection resistor according to the first and second sampled results.

4. The measurement device as claimed in claim 2, wherein the interference elimination unit comprises:
a first switch coupled between the first node and the second voltage-dividing unit and transmitting the voltage of the first node to the second voltage-dividing unit according to a first control component of the control signal; and
a second switch coupled between the second node and the second voltage-dividing unit and transmitting the voltage of the second node to the second voltage-dividing unit according to a second control component of the control signal, wherein the level of the first control component is opposite to the level of the second control component.

5. The measurement device as claimed in claim 2, wherein the first and second switches are transistors.

6. The measurement device as claimed in claim 1, wherein the interference elimination unit provides the voltage of the second node to the second voltage-dividing unit and provides the voltage of the first or second node to the first voltage-dividing unit according to the control signal.

7. The measurement device as claimed in claim 6, wherein the interference elimination unit provides the voltage of the first node to the first voltage-dividing unit and the processing unit generates a first sampled result according to a difference between the first and second processed signals,
the interference elimination unit provides the voltage of the second node to the first voltage-dividing unit and the processing unit generates a first sampled result according to a difference between the first and second processed signals, and
the processing unit obtains the current passing through the detection resistor according to the first and second sampled result.

8. The measurement device as claimed in claim 6, wherein the interference elimination unit comprises:
a first switch coupled between the first node and the first voltage-dividing unit and transmitting the voltage of the first node to the first voltage-dividing unit according to a first control component of the control signal; and
a second switch coupled between the second node and the first voltage-dividing unit and transmitting the voltage of the second node to the first voltage-dividing unit according to a second control component of the control signal, wherein the level of the first control component is opposite to the level of the second control component.

9. The measurement device as claimed in claim 8, wherein the first and second switches are transistors.

10. The measurement device as claimed in claim 1, wherein the interference elimination unit provides the voltage of the first or second node to the first or second voltage-dividing unit according to the control signal,
when the interference elimination unit provides the voltage of the first node to the first voltage-dividing unit, the interference elimination unit provides the voltage of the second node to the second voltage-dividing unit, and
when the interference elimination unit provides the voltage of the second node to the first voltage-dividing unit, the interference elimination unit provides the voltage of the first node to the second voltage-dividing unit.

11. The measurement device as claimed in claim 10, wherein the interference elimination unit provides the voltage of the first node to the first voltage-dividing unit and provides the voltage of the second node to the second voltage-dividing unit, and the processing unit generates a first sampled result according to a difference between the first and second processed signals,
the interference elimination unit provides the voltage of the second node to the first voltage-dividing unit and provides the voltage of the first node to the second voltage-dividing unit, and the processing unit generates a first sampled result according to a difference between the first and second processed signals, and
the processing unit obtains the current passing through the detection resistor according to the first and second sampled result.

12. The measurement device as claimed in claim 10, wherein the interference elimination unit comprises:
a first switch coupled between the first node and the first voltage-dividing unit and transmitting the voltage of the first node to the first voltage-dividing unit according to a first control component of the control signal; and
a second switch coupled between the second node and the first voltage-dividing unit and transmitting the voltage of the second node to the first voltage-dividing unit according to a second control component of the control signal;
a third switch coupled between the first node and the second voltage-dividing unit and transmitting the voltage of the first node to the second voltage-dividing unit according to the second control component; and
a fourth switch coupled between the second node and the second voltage-dividing unit and transmitting the voltage of the second node to the second voltage-dividing unit according to the first control component.

13. The measurement device as claimed in claim 12, wherein the first and second switches are transistors.

14. The measurement device as claimed in claim 1, wherein the control signal is provided by the processing unit.

15. The measurement device as claimed in claim 1, wherein the processing unit is an analog-to-digital converter or an amplifier.

16. The measurement device as claimed in claim 1, wherein the first voltage-dividing unit comprises:
a first resistor coupled between the interference elimination unit and a third node;
a second resistor coupled between the third node and a ground terminal, wherein the first and second resistors divide the voltage of the first or second node to generate the first processed signal and output the first processed signal via the third node.

17. The measurement device as claimed in claim 1, further comprising:
a transformation unit coupled to the interference elimination unit and transforming a switching signal into the control signal.

18. The measurement device as claimed in claim 17, wherein the switching signal is provided by the processing unit.

19. The measurement device as claimed in claim 17, wherein the transformation unit is a level shifter.

20. The measurement device as claimed in claim 1, wherein the detection resistor is coupled to a power pin of a USB type-C connector.

* * * * *